(12) United States Patent
Takahashi

(10) Patent No.: US 8,031,513 B2
(45) Date of Patent: Oct. 4, 2011

(54) SEMICONDUCTOR DEVICE AND METHOD OF OPERATING THEREOF

(75) Inventor: Hiroyuki Takahashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 183 days.

(21) Appl. No.: 12/576,450

(22) Filed: Oct. 9, 2009

(65) Prior Publication Data

US 2010/0091554 A1    Apr. 15, 2010

(30) Foreign Application Priority Data

Oct. 15, 2008    (JP) .................................. 2008-266679

(51) Int. Cl.
*G11C 11/24*    (2006.01)
(52) U.S. Cl. ......... 365/149; 365/203; 365/205; 365/226
(58) Field of Classification Search .................. 365/149, 365/203, 205, 226
See application file for complete search history.

(56) References Cited

U.S. PATENT DOCUMENTS 6,111,802 A *  8/2000  Kano et al. ................. 365/185.2
6,914,840 B2    7/2005  Agata

FOREIGN PATENT DOCUMENTS

JP    2004-265533 (A)    9/2004

* cited by examiner

*Primary Examiner* — Hoai V Ho
(74) *Attorney, Agent, or Firm* — Foley & Lardner LLP

(57) ABSTRACT

A semiconductor device includes: a memory cell; a precharge circuit; a negative potential applying circuit; and a sense amplifier. The memory cell is connected to a first bit line and store data. The precharge circuit is connected to the first and second bit lines and precharges the first and second bit lines to a ground potential. The negative potential applying circuit is connected to the first bit line and applies a negative potential to the first bit line. The sense amplifier is connected to the first and second bit lines and read data based on a difference between a first potential of the first bit line and a second potential of the second bit line. An absolute value of the negative potential is smaller than the difference between the first potential and the second potential.

16 Claims, 8 Drawing Sheets

SEMICONDUCTOR DEVICE AND METHOD OF OPERATING THEREOF

INCORPORATION BY REFERENCE

This application is based upon and claims the benefit of priority from Japanese patent application No. 2008-266679 filed on Oct. 15, 2008, the disclosure of which is incorporated herein in its entirety by reference.

BACKGROUND OF THE INVENTION

1. Field of the Invention

The present invention relates to a semiconductor device and a method of operating thereof, and particularly, the present invention relates to a semiconductor device having a circuit, which is used for a memory, and a method of operating thereof.

2. Description of Related Art

A semiconductor integrated circuit having a memory such as a dynamic random access memory (DRAM) integrated therein has been known. In recent years, in response to the demand of low power consumption, a semiconductor integrated circuit is progressing in lowering of a power source voltage. In response to the demands of this, an embedded DRAM also is progressing in lowering of a power source voltage. However, as lowering of a power source voltage progresses, a threshold voltage of an MOS transistor comes close to a power source voltage, so that there is a possibility that a fast read of the embedded DRAM is difficult. As a technique dealing with this, a DRAM with a ground-precharge configuration has been known.

For example, Japanese Laid-Open Patent Application JP-P2004-265533A (corresponding to U.S. Pat. No. 6,914, 840(B2)) discloses a semiconductor memory circuit. FIG. 1 is a circuit diagram showing a semiconductor memory circuit of JP-P2004-265533A. This semiconductor memory circuit 101 includes a memory cell 102, a dummy cell 104, a precharge circuit 108, and a sense amplifier 106. The memory cell 102 includes a first capacitor 111 and a first transistor Qc. The first capacitor 111 accumulates electric charges corresponding to memory data. The first transistor Qc is connected to a word line WL at a gate, is connected to a first bit line BT at one of source/drain regions, and is connected to a first capacitor 111 at the other of the source/drain regions. The dummy cell 104 includes a second capacitor 112, a second transistor Qr1, and a third transistor Qr2. The second capacitor 112 has a smaller capacitance than that of the first capacitor 111. The second transistor Qr1 is connected to a dummy word line WR at a gate, is connected to a second bit line BN at one of source/drain regions, and is connected to a second capacitor 112 at the other of the source/drain regions. The third transistor Qr2 electrically connects the second capacitor 112 to a voltage line WRP supplying a first voltage in response to a precharge signal when the dummy word line WR is inactive. The precharge circuit 108 precharges first and second bit lines BT and BN to a second voltage when the word line WL and the dummy word line WR are inactive. The sense amplifier 106 detects a potential difference between the first and second bit lines BT and BN when the word line WL and the dummy word line WR are activated and the first and second capacitors 111 and 112 are electrically connected to the first and second bit lines BT and BN, respectively. Then, the sense amplifier 106 amplifies voltages of the first and second bit lines BT and BN to the first and second voltages or the second and first voltages, respectively, when the sense amplifier 106. All of the transitions from an inactive voltage level into an active voltage level of the word line WL and the dummy word line WR are directed from the second voltage to the first voltage.

FIG. 2 is a timing chart showing an operation of the semiconductor memory circuit of JP-P2004-265533A. It is perceived that this semiconductor memory circuit is operated as follows. During a precharge period (as well as before a word selection period), a precharge line PDL is activated (VDD), and the first and second bit lines BT and BN are precharged to a ground voltage by the precharge circuit 108. In addition, a voltage line WRP is activated (VPP), and the second capacitor 112 (a capacitance Cs) is charged via the transistor Qr2. After that, during the word selection period, the word line WL is activated (VPP), and electric charges of the first capacitor 111 (a capacitance CS) is supplied to the first bit line BT via the transistor Qc. As a result, in the case where the electric charges are accumulated in the first capacitor 111 corresponding to the data, a potential of the first bit line BT is BT (H). On the other hand, in the case where the electric charges are not accumulated in the first capacitor 111 corresponding to the data, the potential of the first bit line BT is BT (L): GND. In this case, the dummy word line WR is also activated (VPP), and the electric charges of the second capacitor 112 are supplied to the second bit line BN via the transistor Qr1. As a result, the potential of the second bit line BN is an intermediate potential between BT (H) and BT (L). In other words, BT (H)−BN=BN−BT (L)=ΔV is established. Here, ΔV is determined based on a [bit line capacity Cb]/Cs. After that, the sense amplifier 106 is activated (VDD). As a result, when the potential of the first bit line BT is BT(H), BT(H) is made to increase to VDD. In addition, since the potential of the second bit line BN is BN(H), BN(H) is made to decrease to GND. On the other hand, when the potential of the first bit line BT is BT(L), BT(L) remains GND. In addition, since the potential of the second bit line BN is BN(L), BN(L) is made to increase to VDD.

However, we have now discovered the following facts. According to the semiconductor memory circuit of the above-mentioned JP-P2004-265533A, it is considered that three wiring lines including the dummy word line WR for reading the dummy cell 104, the voltage line WRP for precharging, and the word line WL of the memory cell 102 need to be driven at VPP (or a voltage close to VPP>VDD: positive) that is an activated level and at VBB (negative) that is an inactivated level. A current efficiency of a power source for supplying these both voltages is low, and the percentage of the electric power thereof is forty percent or more in the entire electric power to be consumed on the read operation, which is a largest ratio item. Therefore, in the semiconductor device having the memory circuit, a technique capable of reducing the power consumption is expected.

In addition, on a read operation of the memory cell 102, a potential of BN is raised by ΔV. In this case, a limit of a low voltage operation of the sense amplifier 106 depends on whether or not the gate voltages to be applied to PMOS transistors Q1 and Q3 in the sense amplifier 106 are sufficiently high for the threshold voltage Vth of these transistors. A gate voltage to be applied in this case is (VDD−ΔV), so that (VDD−ΔV)>Vth is an operating limit of the PMOS transistors Q1 and Q3. Here, the semiconductor integrated circuit having the embedded DRAM is made to reduce the power consumption by lowering of the power source voltage VDD of a logic circuit. In this case, if the VDD is lowered, (VDD−ΔV) approaches to Vth, and this causes a danger that an operating rate of the sense amplifier 106 is lowered. In addition, if the VDD is lowered, the influence of ΔV is increased and it is danger that variation of ΔV influences stability of the operation, because ΔV is changed due to variation of Cb/Cs that is easily influenced by the production tolerance. In the semiconductor device having the memory circuit, a technique capable of stably carrying out the read operation while lowering the power source voltage is required.

SUMMARY

The present invention seeks to solve one or more of the above problems, or to improve upon those problems at least in part. In one embodiment, a semiconductor device includes: a memory cell configured to be connected to a first bit line and store data; a precharge circuit configured to be connected to the first bit line and a second bit line and precharge the first bit line and the second bit line to a ground potential; a negative potential applying circuit configured to be connected to the first bit line and apply a negative potential to the first bit line; and a sense amplifier configured to be connected to the first bit line and the second bit line and read data based on a difference between a first potential of the first bit line and a second potential of the second bit line, wherein an absolute value of the negative potential is smaller than the difference between the first potential and the second potential.

In another embodiment, a semiconductor device includes: a memory cell configured to be connected to a first bit line and a first word line; a negative kicker circuit configured to be connected to the first bit line and a second word line; a second bit line configured to be paired with the first bit line; a precharge circuit configured to precharge the first bit line and the second bit line to a ground potential; a sense amplifier configured to amplify a difference between a first potential of the first bit line and a second potential of the second bit line; and a word line control circuit configured to make a transition of a potential of the second word line at a second word line potential gradient, the second word line potential gradient being opposite to a first word line potential gradient, a transition of a potential of the first word line being made from an unselected potential to a selected potential at the first word line potential gradient.

In another embodiment, an operating method of a semiconductor circuit, wherein the semiconductor circuit includes: a memory cell configured to be connected to a first bit line and store data; a precharge circuit configured to be connected to the first bit line and a second bit line and precharge the first bit line and the second bit line to a ground potential; a negative potential applying circuit configured to be connected to the first bit line and apply a negative potential to the first bit line; and a sense amplifier configured to be connected to the first bit line and the second bit line and read data based on a difference between a first potential of the first bit line and a second potential of the second bit line, the operating method, when a read operation, includes: the precharge circuit precharging the first bit line and the second bit line to the ground potential; the negative potential applying circuit applying the negative potential to the first bit line; and the sense amplifier, when the first potential is changed by the memory cell being connected to the first bit line, reading the data based on a difference between the changed first potential and the second potential, wherein an absolute value of the negative potential is approximately equal to a half of potential change of the first potential when the memory cell having electric charges accumulated therein is connected to the first bit line.

The present invention provides a semiconductor device having a memory circuit, which enables to reduce power consumption. Further, the semiconductor device having the memory circuit makes it possible to stably carry out the read operation while lowering a power source voltage.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereinafter, a semiconductor device and a method of operating thereof according to embodiments of the present invention will be described referring to the attached drawings. In this case, the semiconductor device will be described focusing on a circuit that is used for a DRAM included in the semiconductor device.

First Embodiment

Figure 3:
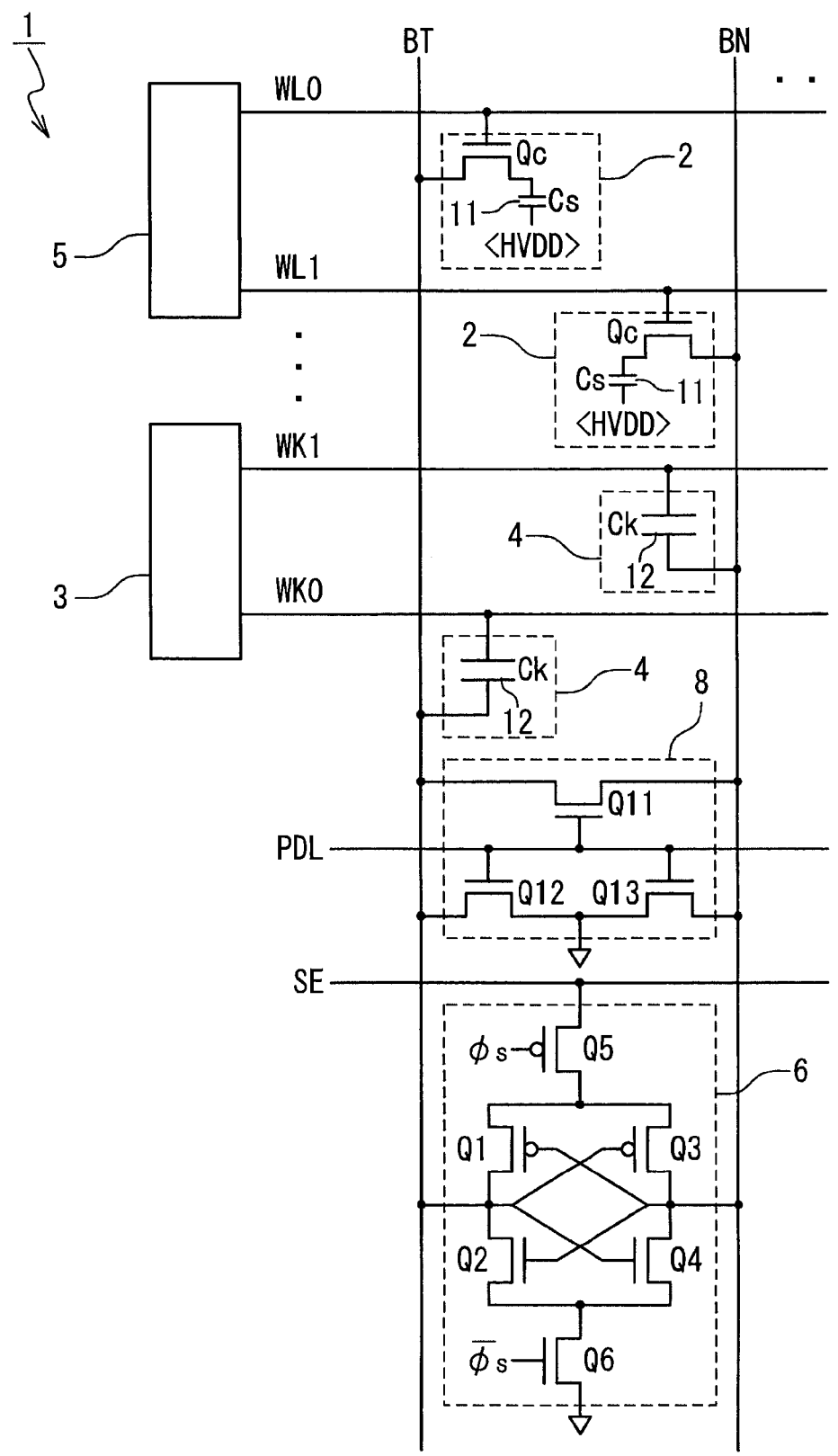
FIG. 3 is a circuit diagram showing a configuration of a semiconductor device according to a first embodiment of the present invention.

FIG. 3 is a circuit diagram showing a configuration of a semiconductor device according to a first embodiment of the present invention. This semiconductor device 1 includes a memory cell 2, a word line decoder 5, a precharge circuit 8, a potential generating circuit 3, a negative kicker circuit 4, and a sense amplifier 6. Here, representing the bit lines, only a pair of bit lines will be described with the illustration of this pair.

The memory cell 2 is connected to any one of a first bit line BT and a second bit line BN to store a data. The memory cell 2 includes a cell capacitor 11 and a cell transistor Qc. The cell capacitor 11 serves as a capacitor of a capacitance Cs to accumulate electric charges corresponding to the data, and has one terminal, which is connected to a power source of a HVDD (½·VDD). The cell transistor Qc includes a gate and source/drain regions. The gate is connected to a first word line WL (WL0, WL1, . . . ) for selecting the memory cell 2. One of the source/drain regions is connected to the other end of the cell capacitor 11. The other of the source/drain regions is connected to any of the first bit line BT and the second bit line BN. Further, in the drawing, one memory cell 2 is connected to each of the first bit line BT and the second bit line BN, however, the present invention is not limited to this and a plurality of memory cells 2 may be connected to each of the both bit lines.

The word line decoder 5 is connected to a plurality of first word lines WL (WL0, WL1, . . . ). The word line decoder 5 selects a selected first word line WL from the plurality of first word lines WL, and applies a certain voltage VPP to this selected first word line WL. The word line decoder 5 makes the transition of the potential of the selected first word line WL from an unselected potential (an exemplification: VBB) to a selected potential (an exemplification: VPP) at a first word line potential gradient. At that time, as described later, the potential generating circuit 3 makes the transition of the potential of the selected second word line from a selected potential (an exemplification: VDD) to an unselected potential (an exemplification: GND) at a second word line potential gradient, which is opposite to the first word line potential gradient. It is also possible to consider the word line decoder 5 and the potential generating circuit 3 as a word line control circuit for controlling the word line. Further, it is obvious that this configuration includes a bit line decoder for selecting and controlling the plurality of first bit lines BT and the plurality of second bit lines BN, although this bit line decoder is not illustrated in the drawings.

The precharge circuit 8 is connected to the first bit line BT and the second bit line BN so as to precharge the first bit line BT and the second bit line BN to a ground potential. The precharge circuit 8 includes a first transistor Q11, a second transistor Q12, and a third transistor Q13. The first transistor Q11 has a gate and source/drain regions. The gate is connected to a precharge line PDL to activate the precharge circuit 8. One of the source/drain regions is connected to the first bit line BT. The other of the source/drain regions is connected to the second bit line BN. The second transistor Q12 has a gate and source/drain regions. The gate is connected to the precharge line PDL. One of the source/drain regions is connected to the first bit line BT. The third transistor Q13 has a gate and source/drain regions. The gate is connected to the precharge line PDL. One of the source/drain regions is connected to the other of the source/drain regions of the second transistor Q12. The other of the source/drain regions is connected to the second bit line BN.

The potential generating circuit 3 is connected to a plurality of second word lines WK. In this example, the potential generating circuit 3 is connected to two second word lines WK0 and WK1. The potential generating circuit 3 selects a selected second word line WK from the plurality of second word lines WK. Then, the potential generating circuit 3 makes the transition of the potential of this selected second word line WK from a certain voltage (an exemplification: GND) to a selected potential (an exemplification: VDD). In other words, the potential generating circuit 3 supplies a certain potential (the exemplification: VDD) to the negative kicker circuit 4 that is connected to the first bit line BT via the second word line WK0. In the same way, the potential generating circuit 3 supplies a certain potential (the exemplification: VDD) to the negative kicker circuit 4 that is connected to the second bit line BN via the second word line WK1. The potential generating circuit 3 may be common to the all bit lines or may be provided individually or every plurality of bit lines. Further, a circuit for supplying a power source voltage to other elements may be shared.

At least one negative kicker circuit 4 is connected to each of the first bit line BT and the second bit line BN. The negative kicker circuit 4 that is connected to the first bit line BT applies a negative potential ($-\Delta V$) to the first bit line BT by using a potential that is generated by the potential generating circuit 3. In the same way, the negative kicker circuit 4 that is connected to the second bit line BN applies a negative potential ($-\Delta V$) to the second bit line BN by using a potential that is generated by the potential generating circuit 3. The negative kicker circuit 4 is a negative potential capacitor 12, for example. The negative potential capacitor 12 is a capacitor of the capacitance Ck, and has two terminals, of which one terminal is connected to the second word line connected to the potential generating circuit 3 and the other terminal is connected to one of the first and second bit line BT and BN. An absolute value of a negative potential ($-\Delta V$) is smaller than a differential potential between a first potential of the first bit line BT and a second potential of the second bit line BN. It is preferable that the absolute value of the negative potential ($-\Delta V$) is approximately equal to a half ($\Delta V$) of potential change ($2\Delta V$: described later) in the potential of the bit line (BT or BN) when the memory cell 2 having the electric charges accumulated therein is connected to the bit line (BT or BN).

For example, the capacitance Ck of the negative potential capacitor 12 can be determined to be approximately half of the capacitance Cs of the cell capacitor 11 (Ck=Cs/2). In this case, the potential generating circuit 3 applies a same potential as the power source voltage VDD to be supplied to the sense amplifier 6 to the negative potential capacitor 12. For example, the negative potential capacitor 12 of Ck=Cs/2 can be produced by connecting two capacitors in series, each of which is the same as the cell capacitor 11.

Further, the potential generating circuit 3 and the negative kicker circuit 4 may be collectively considered as a negative potential supply circuit to apply a negative potential to each of the first and second bit lines, respectively. In addition, as already explained, at least one negative kicker circuit 4 may be connected to each of the first bit line BT and the second bit line BN. In other words, the number of the negative kicker circuit 4 connected to the first bit line BT may be smaller than the number of the memory cell 2 connected to the first bit line BT, for example. Thereby, in the example shown in FIG. 3, at least one capacitor per bit line may be provided, and an area to be used for the circuit to supply a negative potential can be reduced.

The sense amplifier 6 is connected to the first bit line BT and the second bit line BN to read the data of the memory cell 2 on the basis of a difference between the first potential of the first bit line BT and the second potential of the second bit line BN. The sense amplifier 6 is illustrated by a circuit diagram showing an example of the sense amplifier in FIG. 3. The sense amplifier 6 includes transistors Q1 to Q6. The power source voltage VDD (the exemplification: 1.0 V) at a High side is supplied from a control circuit (not illustrated) to the source of the transistor Q5 (a PMOS transistor) via a sense amplifier control line SE. In addition, a ground voltage GND (an exemplification: 0V) is supplied to the source of the transistor Q6 (an NMOS transistor). To the gates of the transistors Q5 and Q6, signals $\phi s$ and $/\phi s$ for controlling the operation of the sense amplifier 6 are supplied from the control circuit. The transistor Q2 (the NMOS transistor) and the transistor Q1 (the PMOS transistor) are connected in series with the gates thereof being connected to a connecting point among the second bit line BN, the transistor Q4 (the NMOS transistor), and the transistor Q3 (the PMOS transistor), the source of the transistor Q2 being connected to the drain of the transistor Q6, and the source of the transistor Q1 being connected to the drain of the transistor Q5, respectively. The transistors Q4 and Q3 are connected in series with the gates thereof being connected to a connecting point among the first bit line BT, the transistor Q2, and the transistor Q1, the source of the transistor Q4 being connected to the drain of the transistor Q6, and the source of the transistor Q3 being connected to the drain of the transistor Q5, respectively. The sense amplifier 6 is disposed between the bit lines BT and BN for each set of them.

Due to the word line decoder 5 and the potential generating circuit 3, the first word line WL is making the transit ion to the selected potential while the second word line (WK) makes the transition to the unselected potential at an antiphase from the first word line WL, and this enables the negative kicker circuit 4 to give the negative potential ($-\Delta V$) to the first bit line BT. Therefore, in the case where the memory cell 2 does not accumulate the electric charges therein, the potential of the first bit line BT remains unchanged ($-\Delta V$), and in the case where the memory cell 2 accumulates the electric charges therein, the potential of the first bit line BT is raised (the exemplification: $+\Delta V$). In this case, by amplifying a differential potential between the first bit line BT and the second bit line BN, the sense amplifier 6 enables the data to be read.

Figure 4:
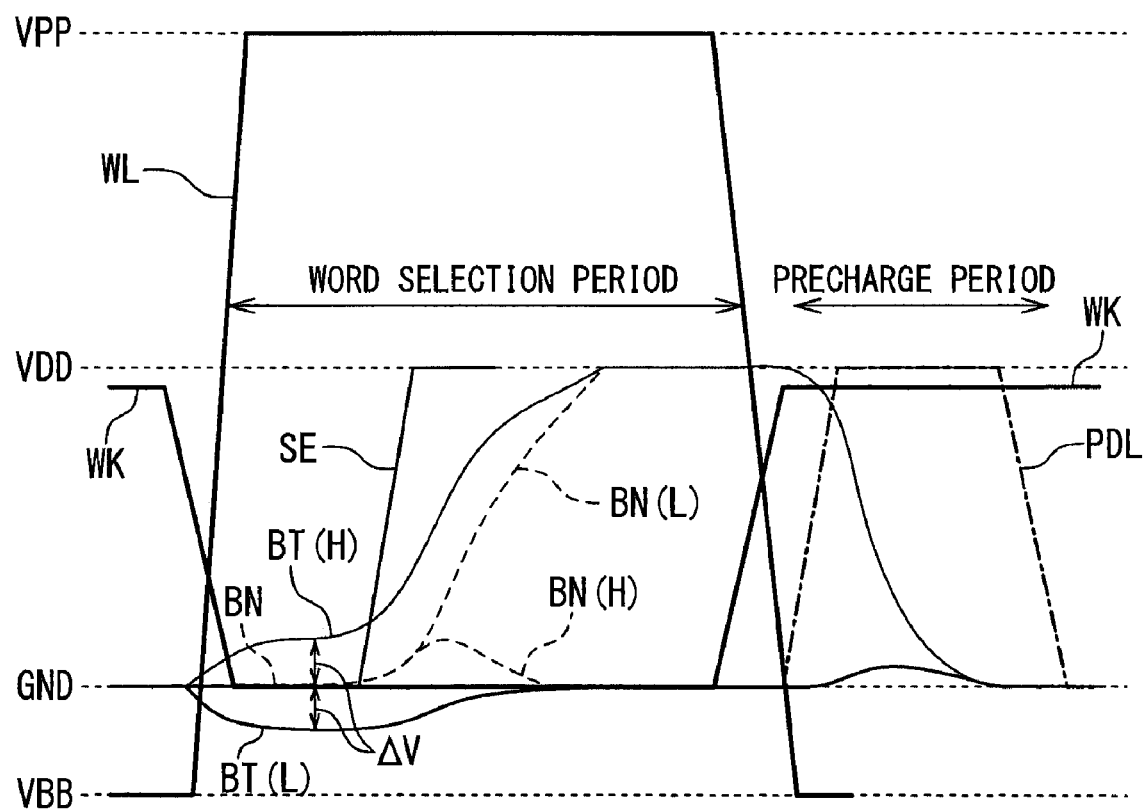
FIG. 4 is a timing chart showing an operation of the semiconductor device according to the first embodiment of the present invention.

FIG. 4 is a timing chart showing an operation of the semiconductor memory circuit according to the first embodiment of the present invention. Here, the case of reading the memory cell 2 of the first word line WL0 will be described. During a precharge period (as well as before a word selection period), the second word line WK0 is activated (VDD) by the potential generating circuit 3, and the negative potential capacitor 12 (Ck=Cs/2) of the negative kicker circuit 4 is charged. In this case, a side of the second word line WK0 is "+", and a side of the first bit line BT is "−". The electric charges to be accumulated are VDD·Cs/2. In addition, the precharge line PDL is activated (VDD), and the first and second bit lines BT and BN are precharged to the ground voltage (GND) by the precharge circuit 8. After that, the precharge line PDL is inactivated (GND) and the precharge circuit 8 is turned off. Thus, the precharge finally ends.

After that, during the word selection period, the potential generating circuit 3 makes the transition of the potential of the second word line WK0 from an active potential level (VDD) into an inactive potential level (GND) at the second word line potential gradient, which is opposite to the first word line potential gradient. This makes the second word line WK0 into inactive (GND), and the "−" electric charges at the side of the first bit line BT of the negative potential capacitor 12 are released. As a result, the potential of the first bit line BT is decreased by $\Delta V=(VDD·Cs/2)/Cb$. Here, Cb is a capacitance of the bit line. On the other hand, at the same time as this, the word line decoder 5 makes the transition of the potential of the first word line WL0 from an inactive potential level (VBB) into an active potential level (VPP) at the first word line potential gradient. This makes the first word line WL0 into active (VPP), and the electric charges of the cell capacitor 11 (Cs) is supplied to the first bit line BT via the transistor Qc.

As a result, (1) in the case where the electric charges are accumulated in the cell capacitor 11 corresponding to the data (the electric charges: VDD·Cs), the potential of the first bit line BT is increased by $\Delta V0=(VDD·Cs)/Cb=2\Delta V$. Accordingly, the potential BT (H) of the first bit line BT is made into $-\Delta V+2\Delta V=\Delta V$. On the other hand, (2) when the electric charges are not accumulated in the cell capacitor 11 corresponding to the data (the electric charges: 0), the potential of the first bit line BT is not varied remaining as $\Delta V0=0/Cb=0$. Therefore, the potential BT (L) of the first bit line BT is made into $-\Delta V+0=-\Delta V$.

In this case, the potential of the second bit line BN at a reference side remains as GND (the ground potential) by precharging. In other words, the potential of the second bit line BN is an intermediate potential between BT (H) and BT (L).

After that, the sense amplifier 6 is activated (SE: VDD). As a result, in the case where the potential of the first bit line BT is BT(H), BT (H) is made into VDD, and BN is made into BN(H)=GND. On the other hand, in the case where the potential of the first bit line BT is BT(L), BT(L) is made into GND, and BN is made into BN(L)=VDD.

According to the method of operating the semiconductor device as described above, it is possible to read the data of the memory cell 2.

Figure 5:
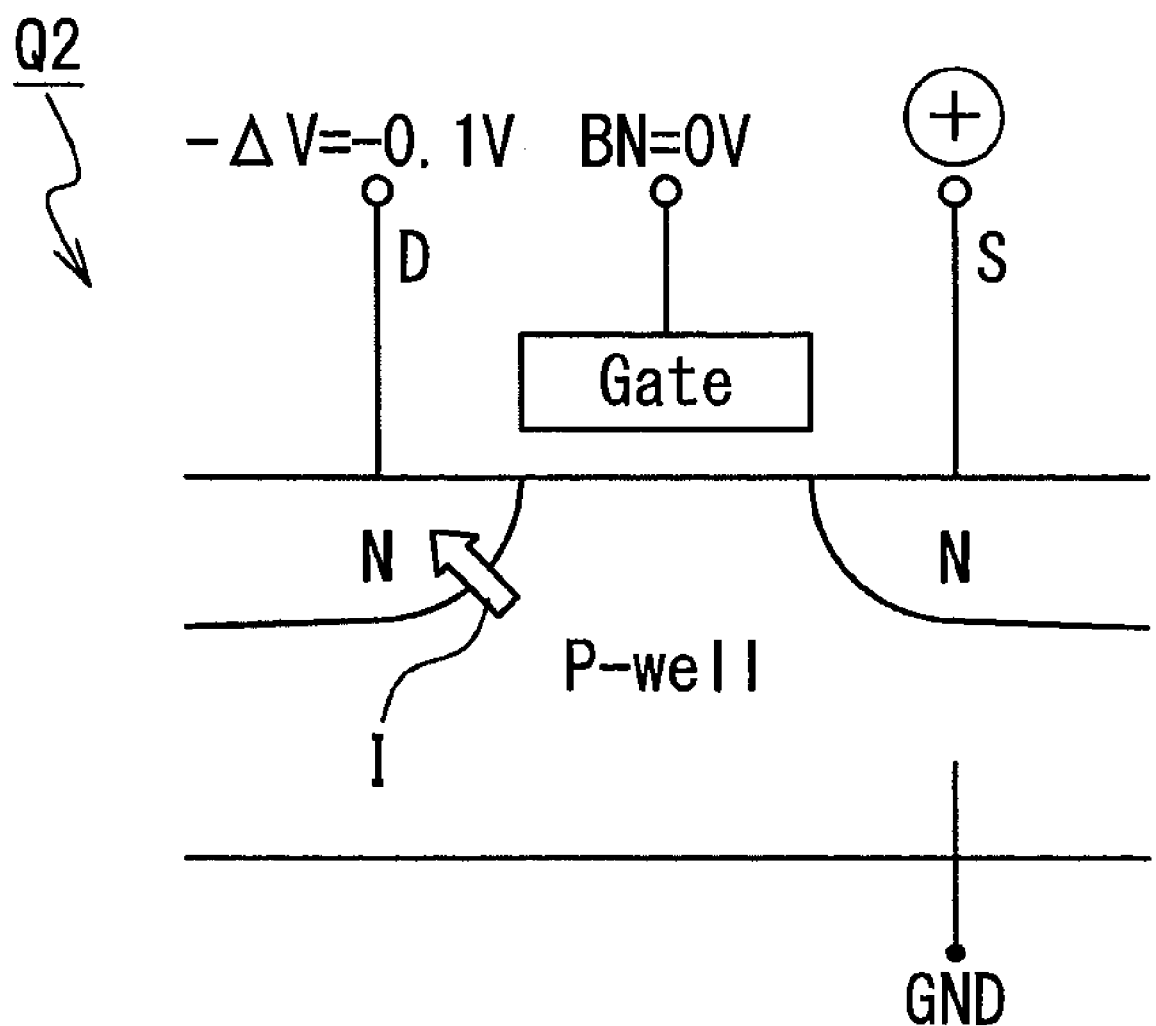
FIG. 5 is a sectional view showing an NMOS transistor of a sense amplifier of FIG. 3 in the operation of FIG. 4.

FIG. 5 is a sectional view showing an NMOS transistor of a sense amplifier of FIG. 3 in the operation of FIG. 4. This view shows the manner of the NMOS transistor Q2 (Q4) of the sense amplifier 6 at the time when BT (L) is $-\Delta V$ at the beginning of the word selection period. As illustrated by the view, at this point, P-well is 0V (GND) and a drain (an N diffusion layer) is $-\Delta V$. In other words, this PN junction is in a forward bias state. Accordingly, the PN junction is turned on and due to this, there is a possibility that an electric current I flows as shown in FIG. 5 (the arrow). However, in this semiconductor device, VDD is lowered. For example, VDD is about 1.0 V. In this case, $-\Delta V$ is about −0.1V at the highest. Therefore, the PN junction is not turned on, so that no electric current flows.

In addition, in order to reduce an off electric current of the cell transistor Qc to the first bit line BT in disturbing, it is necessary to appropriately control a threshold voltage of the cell transistor Qc. For example, in the case where VDD=about 1.0 V, it is preferable that the threshold voltage is about 0.8 to 0.9 V. Thereby, a leakage of electric charges from the cell capacitor 11 can be prevented.

Figure 1:
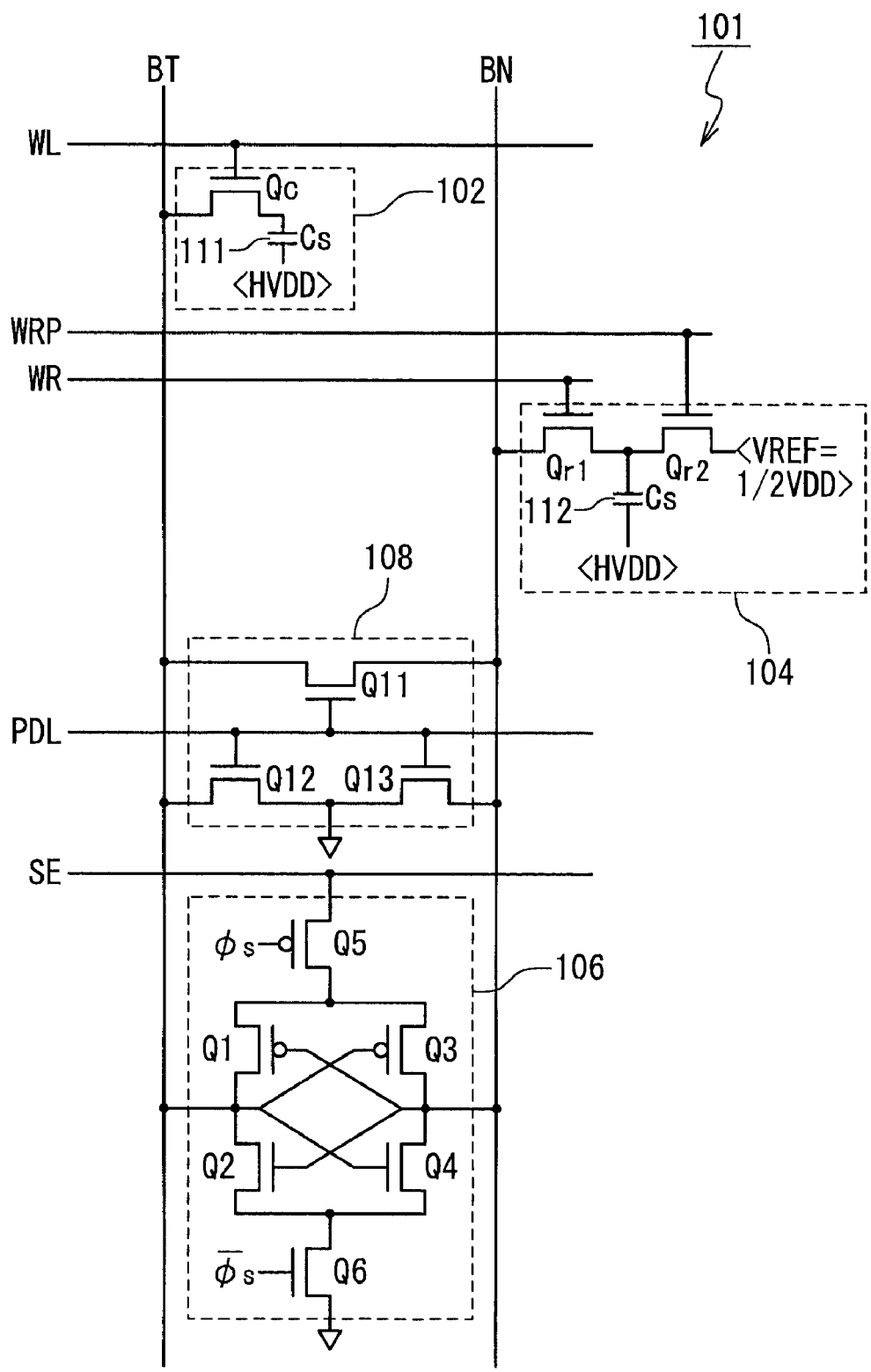
FIG. 1 is a circuit diagram showing a semiconductor memory circuit of JP-P2004-265533A.
Figure 2:
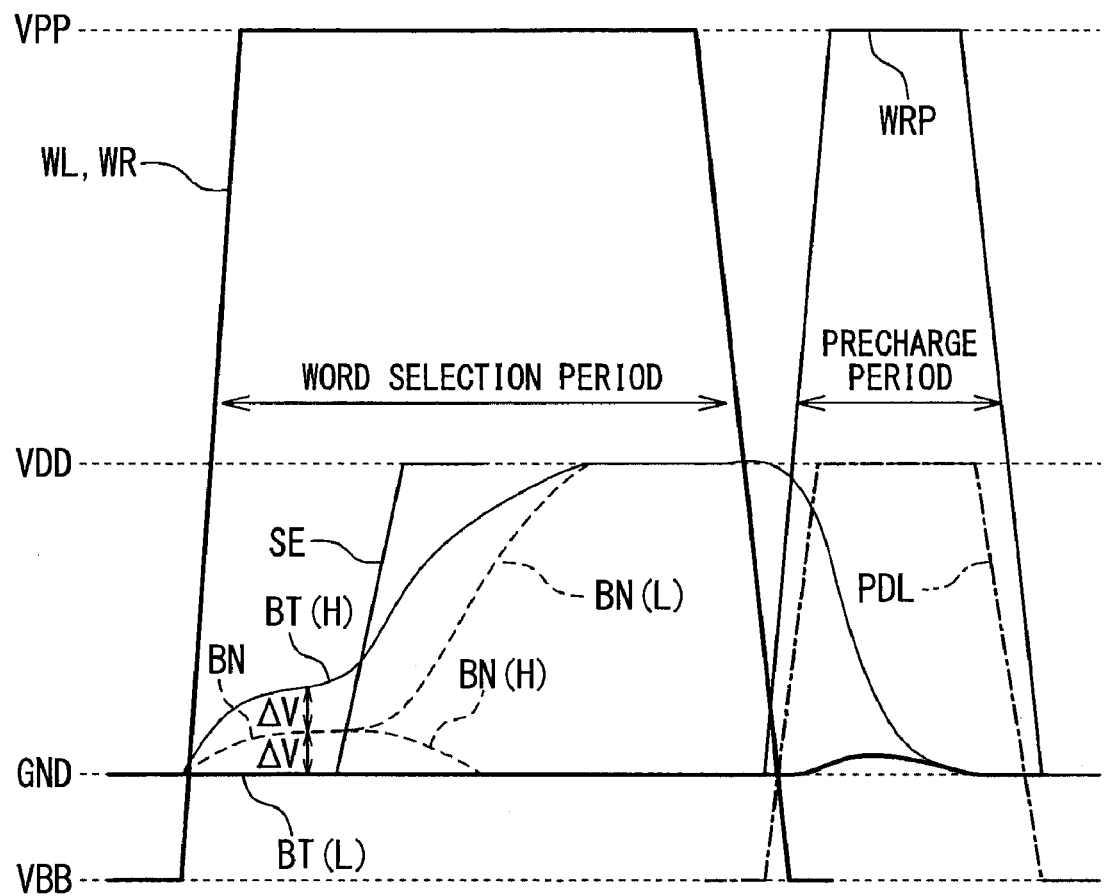
FIG. 2 is a timing chart showing an operation of the semiconductor memory circuit of JP-P2004-265533A.
Figure 6A:
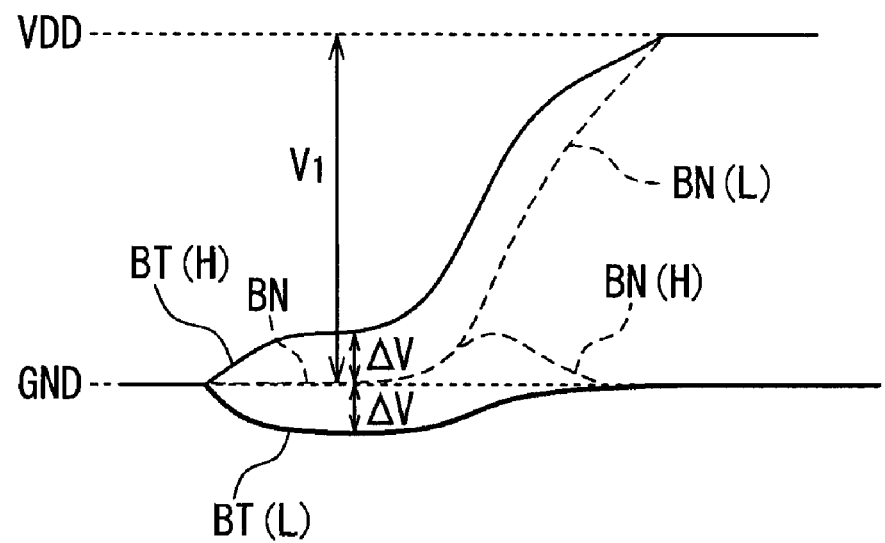
FIG. 6A is a schematic diagram partly showing the timing chart of FIG. 4.
Figure 6B:
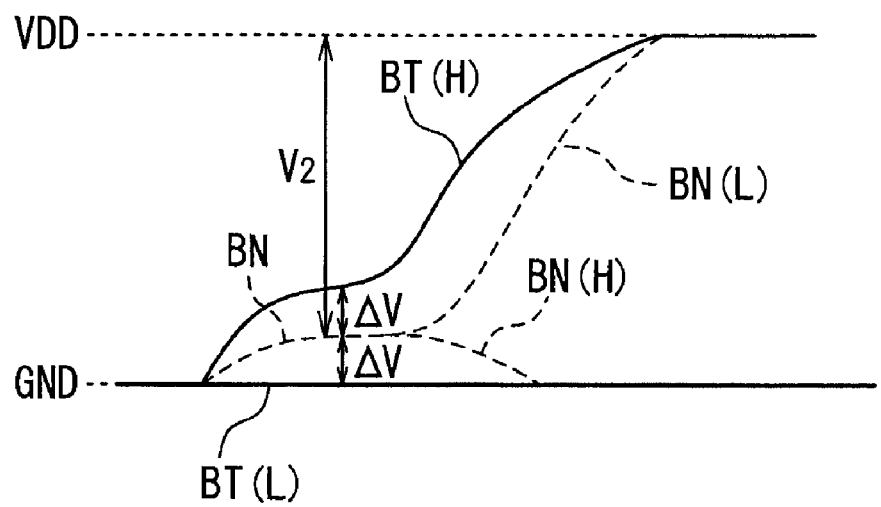
FIG. 6B is a schematic diagram partly showing the timing chart of FIG. 2.

FIGS. 6A and 6B are schematic diagrams partly showing the timing charts of FIG. 4 and FIG. 2, respectively. As shown in FIG. 6B, in the semiconductor memory circuit according to JP-P2004-265533A, the power source voltage of the sense amplifier is VDD and the voltage of the bit line BN at the reference side is $\Delta V$. As a result, the gate voltage to be applied to the PMOS transistors Q1 and Q3 in the sense amplifier is V2=(VDD−$\Delta V$). On the other hand, as shown in FIG. 6A, in the semiconductor device according to the present invention, the power source voltage of the sense amplifier is VDD and the voltage of the bit line BN at the reference side is 0. Therefore, the gate voltage to be applied to the PMOS transistors Q1 and Q3 in the sense amplifier is V1=VDD.

In other words, according to the present invention, in a semiconductor integrated circuit (a semiconductor device) having an embedded DRAM, even in the case where power source voltage VDD is lowered due to lowering of the voltage of the entire system, it is possible to expand the operating limits of the PMOS transistors Q1 and Q3 by $\Delta V$ (=V1−V2). Thereby, it is possible to prevent lowering of an operating rate. In addition, even in the case where the power source voltage VDD is lowered, a read operation can be stably carried out being free from the influence of the production tolerance. It is because the influence of $\Delta V$ on the basis of Cb/Cs, which is varied depending on the production tolerance, is not given on the voltage V1.

According to the present invention, the potential generating circuit 3 and the negative kicker circuit 4 to be used for realizing a ground precharge system are operated at an antiphase from the first word line WL at the VDD amplitude. In other words, the signal line using a VPP potential having a highest potential amplitude and large power consumption are reduced as compared to the semiconductor memory circuit according to JP-P2004-265533A. Accordingly, it is possible to largely reduce active electric current. As a result, the power consumption as the semiconductor device can be reduced.

Particularly, with respect to the semiconductor integrated circuit having the embedded DRAM as the semiconductor device of the present invention, even when the power source voltage is lowered depending on lowering of a voltage of the entire system, a high-speed operation at the DRAM can be carried out and an increase in the power consumption can be also prevented.

Second Embodiment

Figure 7:
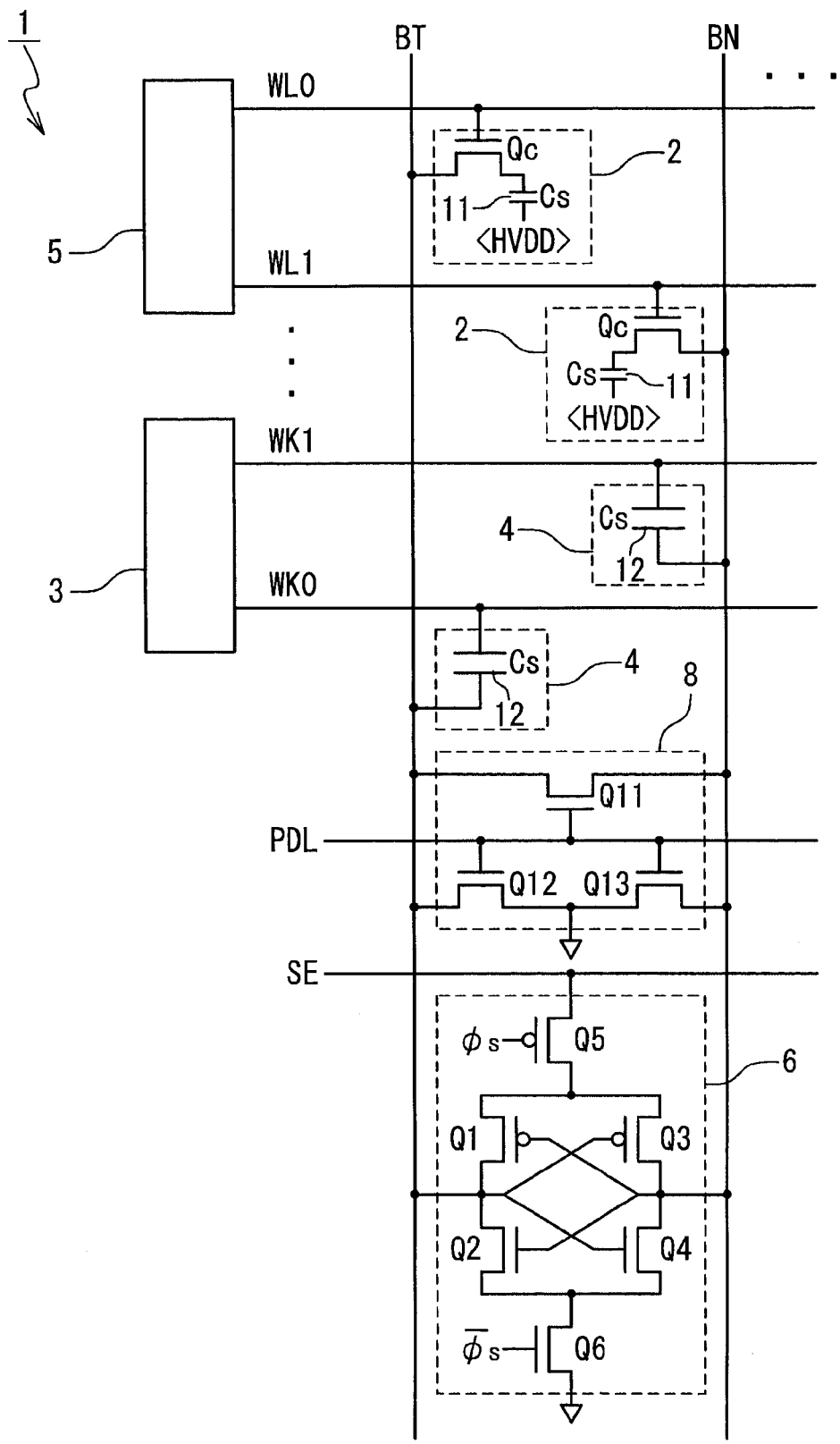
FIG. 7 is a circuit diagram showing a configuration of a semiconductor device according to a second embodiment of the present invention.

FIG. 7 is a circuit diagram showing a configuration of a semiconductor device according to a second embodiment of the present invention. This semiconductor device 1 includes a memory cell 2, a word line decoder 5, a precharge circuit 8, a potential generating circuit 3, a negative kicker circuit 4, and a sense amplifier 6. According to the present embodiment, a basic configuration is the same as the first embodiment (FIG. 3). However, detailed configurations of the potential generating circuit 3 and the negative kicker circuit 4 are different from those of the first embodiment.

In other words, the capacitance Ck of the negative potential capacitor 12 of the negative kicker circuit 4 is determined to be approximately equal to the capacitance Cs of the cell capacitor 11 (Ck=Cs). In this case, the potential generating circuit 3 applies a potential, which is half (VDD/2) of the power source voltage VDD to be supplied to the sense amplifier 6, to the negative potential capacitor 12. As a negative potential capacitor of Ck=Cs, the same one as the cell capacitor may be used, for example. As a voltage that is half (VDD/2) of the potential of the power source voltage VDD, the potential to be applied to the cell capacitor may be used, for example.

The explanations of other functions and other configurations are herein omitted since they are the same as those of the first embodiment.

Figure 8:
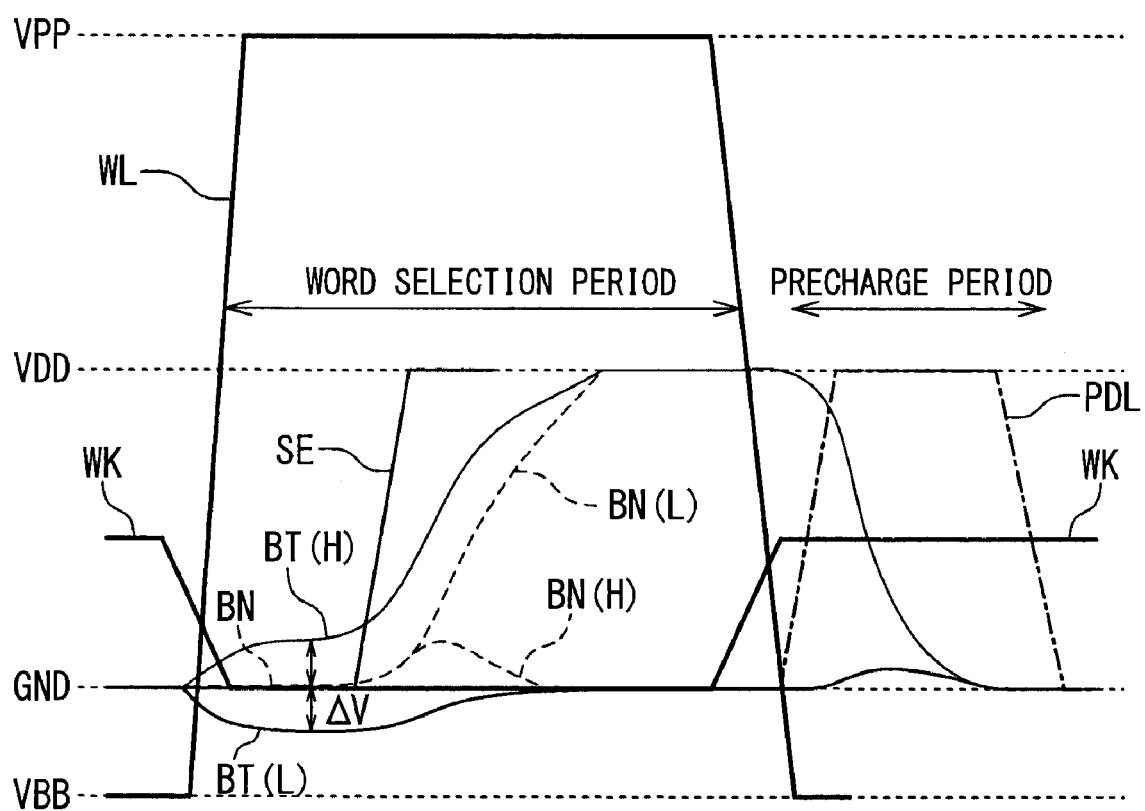
FIG. 8 is a timing chart showing an operation of the semiconductor device according to the second embodiment of the present invention.

FIG. 8 is a timing chart showing an operation of the semiconductor device according to the second embodiment of the present invention. According to the present embodiment, the basic operation is identical to the first embodiment (FIG. 4). However, a detailed operation of the potential generating circuit 3 is different from that of the first embodiment.

In other words, the potential generating circuit 3 applies a potential that is half (VDD/2) of the power source voltage VDD to the negative potential capacitor 12 of the negative kicker circuit 4. Also in this case, the electric charges to be accumulated in the negative potential capacitor 12 is VDD/2·Cs since the capacitance Ck of the negative potential capacitor 12 is Cs, and this is identical to the first embodiment. Accordingly, the same operation as the first embodiment can be carried out.

The present embodiment can obtain a same effect and advantage as the first embodiment. In addition, the negative potential capacitor 12 is the same as the cell capacitor 11 of the memory cell 2, so that a relative error of a capacitance depending on a shape is not generated. In addition, a power source can be shared between the potential generating circuit 3 and the cell capacitor 11 because a potential to be applied to the cell capacitor 11 can be also used as the potential that is half (VDD/2) of the power source voltage VDD applied by the potential generating circuit 3.

Further, according to the present embodiment, the capacitance of the bit line is Cb+2Cs, so that, as compared to the first embodiment, the capacitance is increased by Cs. However, if the capacitance Cb of the bit line is under a general condition, that is, if the capacitance Cb is dominant in the capacitance of the bit line, Cb>>Cs is established. Therefore, it is perceived that the influence (an exemplification: reduction of ΔV) of this is small.

It is apparent that the present invention is not limited to the above embodiment, but may be modified and changed without departing from the scope and spirit of the invention.

Although the present invention has been described above in connection with several exemplary embodiments thereof, it would be apparent to those skilled in the art that those embodiments are provided solely for illustrating the present invention, and should not be relied upon to construe the appended claims in a limiting sense.

What is claimed is:

1. A semiconductor device comprising:
   a memory cell configured to be connected to a first bit line and store data;
   a precharge circuit configured to be connected to said first bit line and a second bit line and precharge said first bit line and said second bit line to a ground potential;
   a negative potential applying circuit configured to be connected to said first bit line and apply a negative potential to said first bit line; and
   a sense amplifier configured to be connected to said first bit line and said second bit line and read data based on a difference between a first potential of said first bit line and a second potential of said second bit line,
   wherein an absolute value of said negative potential is smaller than said difference between said first potential and said second potential.

2. The semiconductor device according to claim 1, wherein said absolute value is approximately equal to a half of potential change of said first potential when said memory cell having electric charges accumulated therein is connected to said first bit line.

3. The semiconductor device according to claim 1, wherein when a read operation is executed,
   said precharge circuit precharges said first bit line and said second bit line to said ground potential,
   said negative potential applying circuit applies said negative potential to said first bit line, and
   said sense amplifier, when said first potential is changed by said memory cell being connected to said first bit line, reads said data based on a difference between said changed first potential and said second potential.

4. The semiconductor device according to claim 1, wherein said memory cell includes:
   a cell capacitor configured to accumulate electric charges corresponding to said data, and
   a cell transistor configured to be connected to a first word line selecting said memory cell at a gate, said cell capacitor at one of source/drain regions, and said first bit line at the other of source/drain regions,
   wherein said negative potential applying circuit includes:
   a negative potential capacitor configured to be connected to a second word line at one end, and said first bit line at the other end, and
   a potential generating circuit configured to charge said negative potential capacitor through said second word line.

5. The semiconductor device according to claim 4, wherein capacitance of said negative potential capacitor is approximately a half of capacitance of said cell capacitor, and wherein said potential generating circuit applies a voltage, which is the same as a power source voltage supplied to said sense amplifier, to said negative potential capacitor.

6. The semiconductor device according to claim 4, wherein capacitance of said negative potential capacitor is approximately equal to capacitance of said cell capacitor, and
wherein said potential generating circuit applies a voltage, which is a half of a power source voltage supplied to said sense amplifier, to said negative potential capacitor.

7. The semiconductor device according to claim 4, wherein the number of said negative potential capacitors connected to said first bit line is smaller than the number of said memory cells connected to said first bit line.

8. The semiconductor device according to claim 4, further comprising:
a word line control circuit configured to supply a potential to said first word line,
wherein said word line control circuit makes a transition of a potential of said first word line from an unselected potential to a selected potential at a first word line potential gradient, and
wherein said potential generating circuit makes a transition of a potential of said second word line at a second word line potential gradient, which is opposite to said first word line potential gradient.

9. The semiconductor device according to claim 2, wherein when a read operation is executed,
said precharge circuit precharges said first bit line and said second bit line to said ground potential,
said negative potential applying circuit applies said negative potential to said first bit line, and
said sense amplifier, when said first potential is changed by said memory cell being connected to said first bit line, reads said data based on a difference between said changed first potential and said second potential.

10. The semiconductor device according to claim 9, wherein said memory cell includes:
a cell capacitor configured to accumulate electric charges corresponding to said data, and
a cell transistor configured to be connected to a first word line selecting said memory cell at a gate, said cell capacitor at one of source/drain regions, and said first bit line at the other of source/drain regions,
wherein said negative potential applying circuit includes:
a negative potential capacitor configured to be connected to a second word line at one end, and said first bit line at the other end, and
a potential generating circuit configured to charge said negative potential capacitor through said second word line.

11. The semiconductor device according to claim 10, wherein capacitance of said negative potential capacitor is approximately a half of capacitance of said cell capacitor, and
wherein said potential generating circuit applies a voltage, which is the same as a power source voltage supplied to said sense amplifier, to said negative potential capacitor.

12. The semiconductor device according to claim 10, wherein capacitance of said negative potential capacitor is approximately equal to capacitance of said cell capacitor, and
wherein said potential generating circuit applies a voltage, which is a half of a power source voltage supplied to said sense amplifier, to said negative potential capacitor.

13. A semiconductor device comprising:
a memory cell configured to be connected to a first bit line and a first word line;
a negative kicker circuit configured to be connected to said first bit line and a second word line;
a second bit line configured to be paired with said first bit line;
a precharge circuit configured to precharge said first bit line and said second bit line to a ground potential;
a sense amplifier configured to amplify a difference between a first potential of said first bit line and a second potential of said second bit line; and
a word line control circuit configured to make a transition of a potential of said second word line at a second word line potential gradient, said second word line potential gradient being opposite to a first word line potential gradient, a transition of a potential of said first word line being made from an unselected potential to a selected potential at said first word line potential gradient.

14. The semiconductor device according to claim 13, wherein said first word line potential gradient is in a positive direction, and said second word line potential gradient is in a negative direction.

15. The semiconductor device according to claim 13, wherein a first potential of said first bit line changing with said first word line potential gradient intersects with a second potential of said second bit line changing with said second word line potential gradient.

16. An operating method of a semiconductor circuit, wherein said semiconductor circuit includes:
a memory cell configured to be connected to a first bit line and store data;
a precharge circuit configured to be connected to said first bit line and a second bit line and precharge said first bit line and said second bit line to a ground potential;
a negative potential applying circuit configured to be connected to said first bit line and apply a negative potential to said first bit line; and
a sense amplifier configured to be connected to said first bit line and said second bit line and read data based on a difference between a first potential of said first bit line and a second potential of said second bit line,
said operating method, when a read operation, comprising:
said precharge circuit precharging said first bit line and said second bit line to said ground potential;
said negative potential applying circuit applying said negative potential to said first bit line; and
said sense amplifier, when said first potential is changed by said memory cell being connected to said first bit line, reading said data based on a difference between said changed first potential and said second potential,
wherein an absolute value of said negative potential is approximately equal to a half of potential change of said first potential when said memory cell having electric charges accumulated therein is connected to said first bit line.

* * * * *